(12) United States Patent
Lambert et al.

(10) Patent No.: US 9,991,149 B2
(45) Date of Patent: *Jun. 5, 2018

(54) SEMICONDUCTOR BONDING WITH COMPLIANT RESIN AND UTILIZING HYDROGEN IMPLANTATION FOR TRANSFER-WAFER REMOVAL

(71) Applicant: Skorpios Technologies, Inc., Albuquerque, NM (US)

(72) Inventors: Damien Lambert, Los Altos, CA (US); John Spann, Albuquerque, NM (US); Stephen Krasulick, Albuquerque, NM (US)

(73) Assignee: SKORPIOS TECHNOLOGIES, INC., Albuquerque, NM (US)

(*) Notice: Subject to any disclaimer, the term of this patent is extended or adjusted under 35 U.S.C. 154(b) by 117 days.

This patent is subject to a terminal disclaimer.

(21) Appl. No.: 14/933,694

(22) Filed: Nov. 5, 2015

(65) Prior Publication Data

US 2016/0133496 A1 May 12, 2016

Related U.S. Application Data

(63) Continuation of application No. 14/562,169, filed on Dec. 5, 2014, now Pat. No. 9,209,142.
(Continued)

(51) Int. Cl.
*H01L 21/683* (2006.01)
*H01L 21/027* (2006.01)
(Continued)

(52) U.S. Cl.
CPC ........ *H01L 21/6835* (2013.01); *G02B 6/4201* (2013.01); *H01L 21/0274* (2013.01);
(Continued)

(58) Field of Classification Search
CPC ............ H01L 21/2007; H01L 21/6835; H01L 21/68313; H01L 27/1266; H01L 2221/67;
(Continued)

(56) References Cited

U.S. PATENT DOCUMENTS 5,780,875 A  7/1998 Tsuji et al.
6,242,324 B1  6/2001 Kub et al.
(Continued)

FOREIGN PATENT DOCUMENTS

WO  2013/109955 A1  7/2013

OTHER PUBLICATIONS

International Preliminary Report on Patentability dated Mar. 16, 2017 for International Patent Application No. PCT/US2015/048176; all pages.
(Continued)

*Primary Examiner* — Jesse Y Miyoshi
*Assistant Examiner* — David Spalla
(74) *Attorney, Agent, or Firm* — Kilpatrick Townsend & Stockton LLP

(57) ABSTRACT

A transfer substrate with a compliant resin is used to bond one or more chips to a target wafer. An implant region is formed in a transfer substrate. A portion of the transfer substrate is etched to form a riser. Compliant material is applied to the transfer substrate. A chip is secured to the compliant material, wherein the chip is secured to the compliant material above the riser. The chip is bonded to a target wafer while the chip is secured to the compliant material. The transfer substrate and compliant material are removed from the chip. The transfer substrate is opaque to UV light.

20 Claims, 16 Drawing Sheets

Related U.S. Application Data

(60) Provisional application No. 62/046,500, filed on Sep. 5, 2014.

(51) Int. Cl.
  *H01L 23/00* (2006.01)
  *H01L 21/762* (2006.01)
  *G02B 6/42* (2006.01)
  *H01L 21/20* (2006.01)

(52) U.S. Cl.
  CPC ...... *H01L 21/683* (2013.01); *H01L 21/76254* (2013.01); *H01L 24/03* (2013.01); *H01L 24/27* (2013.01); *H01L 24/75* (2013.01); *H01L 24/89* (2013.01); *H01L 24/94* (2013.01); *H01L 21/2007* (2013.01); *H01L 24/83* (2013.01); H01L 2221/6834 (2013.01); H01L 2221/68313 (2013.01); H01L 2221/68318 (2013.01); H01L 2221/68354 (2013.01); H01L 2221/68368 (2013.01); H01L 2221/68381 (2013.01); H01L 2224/0362 (2013.01); H01L 2224/75305 (2013.01); H01L 2224/75315 (2013.01); H01L 2224/80201 (2013.01); H01L 2224/83203 (2013.01); H01L 2225/06593 (2013.01); H01L 2924/01014 (2013.01); H01L 2924/1032 (2013.01); H01L 2924/12041 (2013.01); H01L 2924/12042 (2013.01); H01L 2924/12043 (2013.01); H01L 2924/15738 (2013.01)

(58) Field of Classification Search
  CPC ..... H01L 2221/683; H01L 2221/68304; H01L 2221/68368; H01L 2224/03001; H01L 2224/03002; H01L 2224/8003; H01L 2224/8006
  See application file for complete search history.

(56) References Cited

U.S. PATENT DOCUMENTS

| | | | |
|---|---|---|---|
| 6,316,286 B1 * | 11/2001 | Trezza | G02B 6/4249 438/107 |
| 6,393,171 B2 | 5/2002 | Sasaki et al. | |
| 6,485,993 B2 | 11/2002 | Trezza et al. | |
| 6,828,657 B2 | 12/2004 | Hara et al. | |
| 6,942,396 B2 | 9/2005 | Marion et al. | |
| 6,959,863 B2 | 11/2005 | Figuet et al. | |
| 7,755,113 B2 | 7/2010 | Yamazaki et al. | |
| 7,842,547 B2 | 11/2010 | Shelton et al. | |
| 7,851,332 B2 | 12/2010 | Yamazaki et al. | |
| 8,222,084 B2 | 7/2012 | Dallesasse et al. | |
| 8,283,683 B2 | 10/2012 | Tsai et al. | |
| 8,463,088 B1 | 6/2013 | Asghari et al. | |
| 8,722,464 B2 | 5/2014 | Dallesasse et al. | |
| 8,859,394 B2 | 10/2014 | Dallesasse et al. | |
| 9,209,142 B1 * | 12/2015 | Lambert | H01L 24/03 |
| 2003/0114001 A1 | 6/2003 | Jones et al. | |
| 2004/0110320 A1 | 6/2004 | Aspar et al. | |
| 2005/0233504 A1 | 10/2005 | Masato et al. | |
| 2006/0030122 A1 | 2/2006 | Shimoda et al. | |
| 2006/0093002 A1 | 5/2006 | Park et al. | |
| 2006/0273319 A1 | 12/2006 | Dairiki et al. | |
| 2009/0267173 A1 | 10/2009 | Takahashi et al. | |
| 2009/0278233 A1 | 11/2009 | Pinnington et al. | |
| 2009/0294803 A1 | 12/2009 | Nuzzo et al. | |
| 2010/0123268 A1 | 5/2010 | Menard | |
| 2011/0032964 A1 | 2/2011 | Sauer et al. | |
| 2011/0085577 A1 | 4/2011 | Krasulick et al. | |
| 2011/0085760 A1 | 4/2011 | Han et al. | |
| 2011/0244613 A1 | 10/2011 | Heck et al. | |
| 2012/0305916 A1 * | 12/2012 | Liu | H01L 22/34 257/48 |
| 2013/0069275 A1 | 3/2013 | Menard et al. | |
| 2013/0210214 A1 | 8/2013 | Dallesasse et al. | |
| 2013/0256907 A1 | 10/2013 | Sadaka et al. | |
| 2014/0048123 A1 | 2/2014 | Tauke-Pedretti et al. | |

OTHER PUBLICATIONS

ISO/WO dated May 15, 2013 for International Patent Application PCT/US/2013/022244 filed on Jan. 13, 2013; all pages.
Notice of Allowance dated Jun. 11, 2014 for U.S. Appl. No. 13/745,577, filed Jan. 18, 2013; all pages.
ISR/WO dated Nov. 30, 2015 for International Patent Application PCT/US2015/048176 filed Sep. 2, 2015; all pages.
EP15837255.7 received an Extended European Search Report dated Apr. 6, 2018, 7 pages.

* cited by examiner

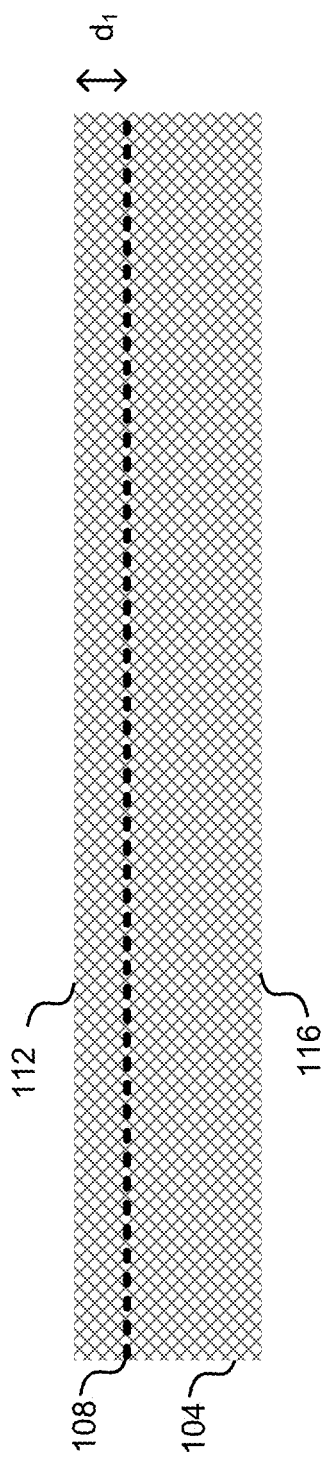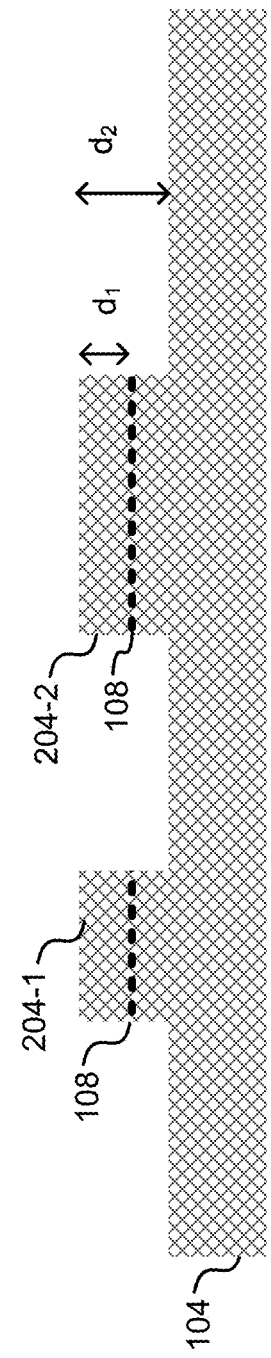

SEMICONDUCTOR BONDING WITH COMPLIANT RESIN AND UTILIZING HYDROGEN IMPLANTATION FOR TRANSFER-WAFER REMOVAL

CROSS-REFERENCES TO RELATED APPLICATIONS

This application is a continuation of U.S. patent application Ser. No. 14/562,169, filed on Dec. 5, 2014, entitled "Semiconductor Bonding with Compliant Resin and Utilizing Hydrogen Implantation for Transfer Wafer Removal," now U.S. Pat. No. 9,209,142, which claims priority to U.S. Provisional Patent Application No. 62/046,500, filed on Sep. 5, 2014, entitled "Semiconductor Bonding with Compliant Resin and Utilizing Hydrogen Implantation for Transfer Wafer Removal," the disclosures of which are hereby incorporated by reference in their entirety for all purposes.

BACKGROUND OF THE INVENTION

This application relates to wafer bonding. More specifically, and without limitation, to bonding semiconductors to create an optical device. Advanced electronic functions (e.g., photonic device bias control, modulation, amplification, data serialization and de-serialization, framing, and routing) are sometimes deployed on silicon integrated circuits. One reason for this is the presence of a global infrastructure for the design and fabrication of silicon integrated circuits that enables the production of devices having very advanced functions and performance at market-enabling costs. Silicon has not been useful for light emission or optical amplification due to its indirect energy bandgap.

Compound semiconductors (e.g., indium phosphide, gallium arsenide, and related ternary and quaternary materials) have been used for optical communications, and in particular for light emitting devices and photodiodes because of their direct-energy bandgap. However, integration of advanced electrical functions on these materials has been limited to niche, high-performance applications due to higher costs of fabricating devices and circuits in these materials. Further, integration of ternary and quaternary materials with silicon is challenging because of lattice mismatch between materials.

BRIEF SUMMARY

Skorpios Template Assisted Bonding™ (STAB™) of chips (e.g., III-V) on a target wafer using metal alloys is challenging due to variability in thickness of chips (e.g., chips comprising III-V material), especially when a large number of chips (e.g., from different sources and/or varying thicknesses) are packed on a target wafer (e.g., a wafer comprising silicon). An example of a STAB process is given in U.S. application Ser. No. 13/745,577, filed on Jan. 18, 2013, which in incorporated by reference. In some embodiments, chip positioning (e.g., vertical height, sometimes referred to as "z-height") with uniform pressure across a large-diameter wafer can be achieved with help of a compliant resin on a transfer wafer and height-positioning pedestals on the target wafer. However, not all compliant resins can accommodate high annealing temperatures (e.g., temperatures greater than 200 and/or 300 degrees Celsius) for effective bonding of the chips to the target wafer. Further, in some embodiments, resins that are capable of high annealing temperatures are not compatible with the STAB™ process for one or more of the following reasons:

(1) removal of the transfer wafer attached to the chips with the resin sometimes uses heat and a shear force, which tends to tear the chips from bonding sites on the target wafer; and/or
(2) removal of the transfer wafer attached to the chips with the resin sometimes uses a substrate of the transfer wafer made of material (e.g., glass or sapphire) that is transparent to short wavelengths of light (e.g., Ultraviolet (UV) light having a wavelength from 200 nm to 400 nm) to allow de-bonding of the resin through the substrate of the transfer wafer with a laser. Unfortunately, transparent materials being used (e.g., glass and sapphire) have thermal expansion coefficients different than that of the target wafer. For example, in some embodiments, the target wafer comprises a silicon substrate. When trying to use a non-silicon transfer substrate (e.g., glass or sapphire) to bond a chip to the silicon substrate of the target wafer, the expansion difference between the silicon substrate and the non-silicon substrate is greater than chip placement tolerance. This problem increases when using large non-silicon substrates (e.g., substrates with diameter equal to or greater than 200 mm). During annealing, chips can be shifted (e.g., chips at edges of the transfer wafer) by several tens of microns from an original alignment at room temperature. It is noted that silicon, InP, and GaAs are opaque to light with shorter wavelength than about 900 nm, thus UV light cannot be used to shine through silicon, InP, or GaAs in de-bonding the transfer wafer from the resin.

In some embodiments, a method for bonding one or more chips to the target wafer is performed by both the transfer wafer and the target wafer having matched thermal expansion coefficients (e.g., the target wafer has a substrate made of silicon and the transfer wafer has a substrate made of silicon; and/or no more than a 10, 6, 4, 2, and/or 1 micron expansion difference at 300 C). Compliant material (e.g., a compliant resin) is used to bond the chips to the transfer wafer, wherein the compliant material can resist high annealing temperatures (e.g., greater than 200 C). Removing the transfer substrate (i.e., de-bonding) is achieved with the use of ion implantation (e.g., using hydrogen, He, B, and/or Si ions) in the transfer substrate followed by heat treatment. The ion implantation is performed close to the surface of the transfer substrate, either over the entire transfer substrate or locally (e.g., within risers). Thus the transfer substrate can be opaque to UV light. And since both the transfer substrate and the target substrate have matched thermal expansion coefficient (e.g., both silicon), the relative position of the chips between the transfer substrate and the target substrate do not change much, if any, during annealing.

Upon applying heat (e.g., greater than 200, 250, and/or 350 C), a portion of the transfer substrate separates at the hydrogen implant region leaving a residual portion of the transfer substrate bonded to the compliant material. Removal of the residual portion can be achieved with standard etching methods. Removal of the compliant material from the chip, after the chip is bonded to the target wafer, can be achieved with solvents since the compliant material is accessible.

In some embodiments, a method for bonding one or more chips to a semiconductor using a compliant resin is described. An implant region is formed in a transfer substrate, wherein the implant region is formed at a first depth in the transfer substrate. A portion of the transfer substrate is etched to form a riser, wherein: the portion of the transfer substrate etched is etched to a second depth; the second depth is greater than the first depth in relation to a surface of the transfer substrate; and at least a part of the riser is not etched to the second depth, such that the riser comprises a portion of the implant region. A compliant material is applied to the transfer substrate. A chip is secured to the compliant material, wherein the chip is secured to the compliant material above the riser. An excess of the compliant material is removed, wherein: the excess of the compliant material comprises material that is not between the riser and the chip; removing the excess of the compliant material leaves a column of the compliant material; and the column of the compliant material is between the riser and the chip. The chip is bonded to a target wafer, wherein bonding the chip to the target wafer is performed while the chip is secured to the column of the compliant material. The transfer substrate is fractured at the implant region, such that a residual portion of the riser is separable from the transfer substrate. The transfer substrate is removed from the residual portion of the riser, wherein the residual portion of the riser is connected to the column of the compliant material. The residual portion of the riser is removed from the column of the compliant material, wherein the residual portion of the riser is removed from the column of the compliant material after removing the transfer substrate from the residual portion of the riser; and the column of the compliant material is removed from the chip, wherein removing the column of the compliant material from the chip is performed after removing the residual portion of the riser from the column of the compliant material. In some embodiments, a pit is formed in the compliant resin, wherein: the pit is formed by removing a portion of the compliant material to form the pit; the pit is formed in the compliant material above the riser; and the chip is secured to a surface of the pit. In some embodiments, the pit is filled with a material to protect sides of the chip; and a portion of the chip is removed, or material is added to the chip, while the chip is secured to the compliant material. In some embodiments, the material to protect sides of the chip is a photoresist or polymer material. In some embodiments, the target wafer comprises silicon; the transfer substrate comprises silicon; and the chip comprises a III-V semiconductor material. In some embodiments, the transfer substrate and/or the target substrate are opaque to light in a range having a wavelength from 200 nm to 400 nm. In some embodiments, the implant region is a hydrogen, B, He, or Si implant region. In some embodiments, the target wafer comprises walls and a floor forming a recess; the chip is bonded to the floor of the recess of the target wafer; and the riser has a width that is greater than a width of the recess. In some embodiments, a second chip is secured to the compliant material; and the second chip is bonded to the target wafer concurrently with bonding the chip to the target wafer.

In some embodiments, a transfer wafer for bonding chips to a semiconductor using a compliant resin is disclosed. The transfer substrate comprises a substrate, a compliant material, and walls in the compliant material forming a pit. The substrate is opaque to ultra-violet light in a 200 nm-400 nm range; the substrate comprises semiconductor material; and the substrate comprises an implant region. The compliant material is disposed on the substrate. In some embodiments, the substrate comprises a riser and an implant region within the riser. In some embodiments, a chip is secured within the pit. In some embodiments, photoresist and/or polymer material is placed in the pit with the chip. In some embodiments, the substrate comprises silicon and the chip comprises III-V semiconductor material.

In some embodiments, a method for bonding chips to a semiconductor using a compliant resin is disclosed. A compliant material is applied to a transfer substrate, wherein the transfer substrate is opaque to ultra-violet light in a 200 nm to 400 nm range. A pit if formed in the compliant material. A chip is secured in the pit of the compliant material. Excess compliant material is removed, wherein removing the excess of the compliant material leaves a column of the compliant material between the transfer substrate and the chip. The chip is bonded to a target wafer, wherein bonding the chip to the target wafer is performed while the chip is secured to the column of the compliant material. The transfer substrate is removed from the column of the compliant material. And the column of the compliant material is removed from the chip.

In some embodiments, the compliant material also accommodates temperatures used for annealing a bonding alloy.

BRIEF DESCRIPTION OF THE DRAWINGS

FIG. 1 depicts a simplified cross section of an embodiment of a transfer substrate having an implant region.

FIG. 2 depicts a simplified cross section of an embodiment with risers formed in the transfer substrate.

Figure 3:
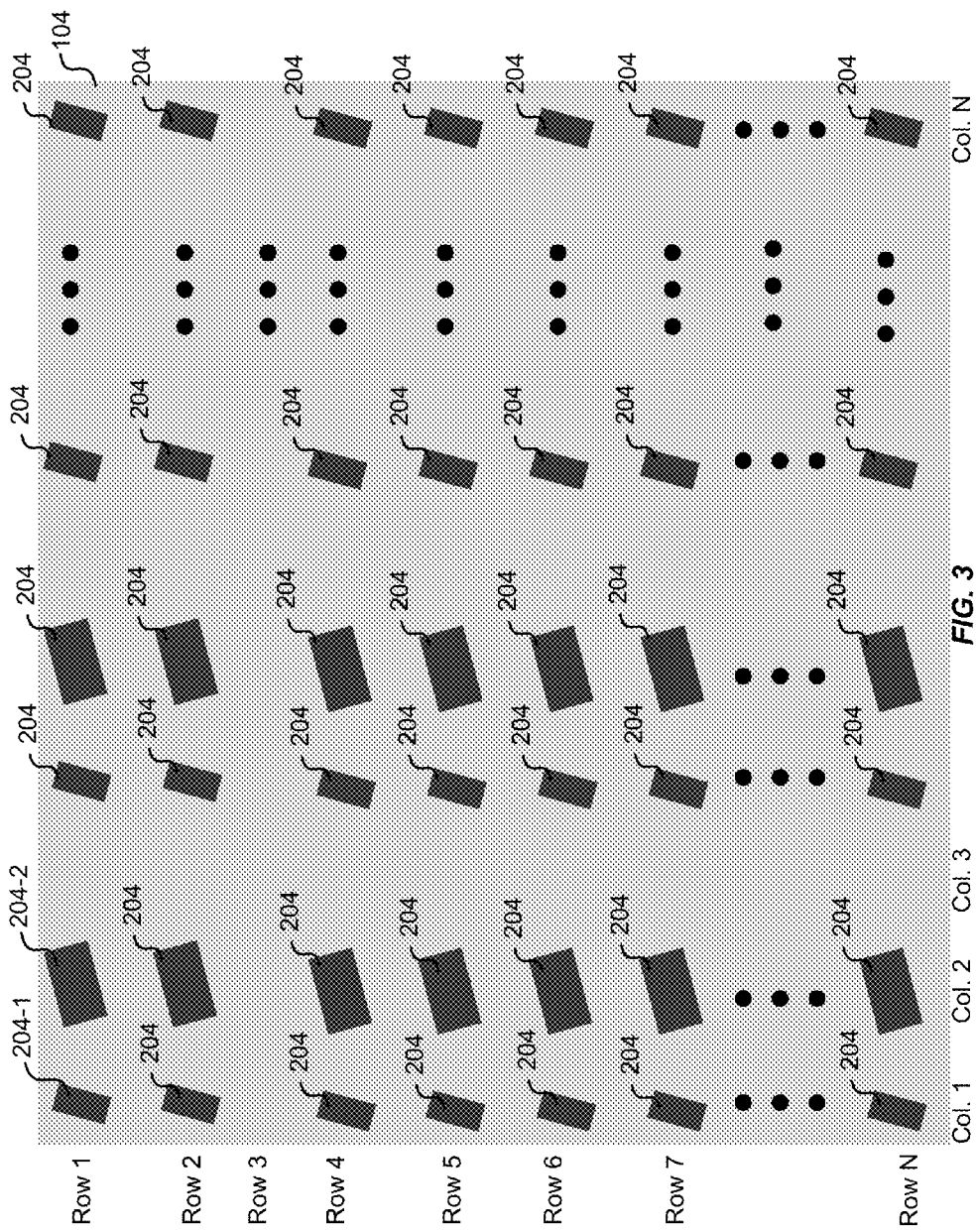
FIG. 3 depicts a simplified top view of an embodiment of the transfer substrate having a plurality of risers.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

The ensuing description provides preferred exemplary embodiment(s) only, and is not intended to limit the scope, applicability, or configuration of the disclosure. Rather, the ensuing description of the preferred exemplary embodiment(s) will provide those skilled in the art with an enabling description for implementing a preferred exemplary embodiment. It is understood that various changes may be made in the function and arrangement of elements without departing from the spirit and scope as set forth in the appended claims.

FIG. 1 depicts a simplified cross section of an embodiment of a transfer substrate 104 having an implant region 108. The transfer substrate 104 is used as part of a transfer wafer in bonding one or more chips to a target wafer. For example, a target wafer comprises silicon. Waveguides (e.g., optical waveguides for light transmission having a wavelength in the 1.3 and/or 1.5 micron range) and mirrors (e.g., gratings optically coupled to the waveguides) are formed in the target wafer. A chip (e.g., made of III-V semiconductor material) is used as a gain medium for a laser. The chip is to be disposed between two mirrors in the target wafer and coupled with the two mirrors by optical waveguides. The chip is bonded (e.g., under-bump metallization using heat greater than 200, 250, and/or 350 degrees Celsius) to the target wafer. In some embodiments, multiple devices are created together to speed production and/or reduce costs of each device. For example, 3200 chips are secured to the transfer wafer to be bonded to 3200 placement sites on the target wafer, one chip at each placement site. If the transfer substrate 104 has a different heat-expansion coefficient than a substrate of the target wafer, there can be misalignment between the chips and the placement sites during bonding. Thus in some embodiments, the transfer substrate 104 is made of similar material as the target substrate so that both the transfer substrate 104 and the target substrate have similar heat-expansion coefficients; or the transfer substrate 104 and the target substrate are made of different materials but have matching heat-expansion coefficients. In some embodiments, the transfer substrate 104 and the target substrate are both silicon (e.g., both crystalline silicon; the target substrate is a handle portion of a silicon-on-insulator (SOI) wafer and the transfer substrate 104 is a flat silicon wafer).

The transfer substrate 104 further comprises a top surface 112 and a bottom surface 116. The implant region 108 forms a plane that is parallel, or substantially parallel, with the top surface 112 and/or the bottom surface 116. The implant region 108 is formed at a first depth, $d_1$, from the top surface 112. In some embodiments, $d_1$, is between 0.25 and 4 microns (e.g., 0.25, 0.5, 1, 2, or 4 microns). In some embodiments, the first depth, $d_1$, is minimized to reduce etching in later steps. In some embodiments, the implant region 108 is made by ion implantation (e.g., using hydrogen, He, B, and/or Si ions).

FIG. 2 depicts a simplified cross section of an embodiment with risers 204 formed in the transfer substrate 104. The risers 204 are formed by etching portions of the transfer substrate 104 around the risers 204. The portions of the transfer substrate 104 around the risers 204 are etched to a second depth, $d_2$, from the top surface 112 of the transfer substrate 104. The second depth, $d_2$, is greater than the first depth, $d_1$, such that the risers 204 comprise the implant region 108. In FIG. 2, a first riser 204-1 and a second riser 204-2 are shown for illustrative purposes. It is to be understood that in some embodiments there are many more than two risers 204. In some embodiments, there may be only one riser 204. In some embodiments, the risers 204 are used to localize separation of the transfer substrate 104 (e.g., to areas near the chips so that there is not as much debris caused when fracturing the transfer substrate 104 at the implant region 108). In some embodiments, risers 204 are not used, and compliant material is applied to a transfer substrate 104 without forming risers 204 in the transfer substrate (e.g., to reduce a processing step).

In some embodiments, the risers 204 are positioned to correspond to (e.g., mirror image of) bonding sites (e.g., recesses formed in the target wafer). In some embodiments, a riser 204 has a surface area that is smaller or larger than a surface area of a corresponding recesses of the target wafer. For example, a smaller surface area of a riser 204 may help in alignment of chips to bonding sites in the target wafer, while a larger surface area may help to keep debris (after the riser 204 is fractured at the implant region 108) from falling into a corresponding recess of the target wafer.

FIG. 3 depicts a simplified top view of an embodiment of the transfer substrate 104 having many risers 204. The transfer substrate 104, represented by a large, lighter-shaded rectangle, has risers 204, represented by smaller, darker rectangles. The risers 204 are arranged in rows and columns. For example, the first riser 204-1 is in row 1, column (col.) 1; the second riser 204-2 is in row 1, col. 2. Additional risers 204 are in row 2, row 4, row 5, row 6, and row 7, to row N. Row 3 does not have any risers 204. Risers 204 are in col. 1, col. 2, and columns to col. N. A third column, col. 3, does not have any risers 204. The risers 204 correspond to locations of the transfer wafer to where chips are to be secured to the transfer wafer. In some embodiments, the chips are InP chips used for gain media or modulators. The risers 204 of the transfer substrate 104 are arranged in a pattern to match bonding sites (sometimes referred to as target sites) in the target wafer (e.g., so chips secured above the risers 204 of transfer substrate 104 can be bonded in the recesses of the target wafer).

A row and/or a column may be left blank for matching to a target wafer (e.g., target wafer is to be cut after bonding chips to the target wafer, and the target wafer has eight recesses per laser system: four pits for four lasers and four pits for four modulators; thus each laser system has four lasers and four modulators). Blank rows and/or columns are provided to give room for dicing the target wafer.

Figure 4:
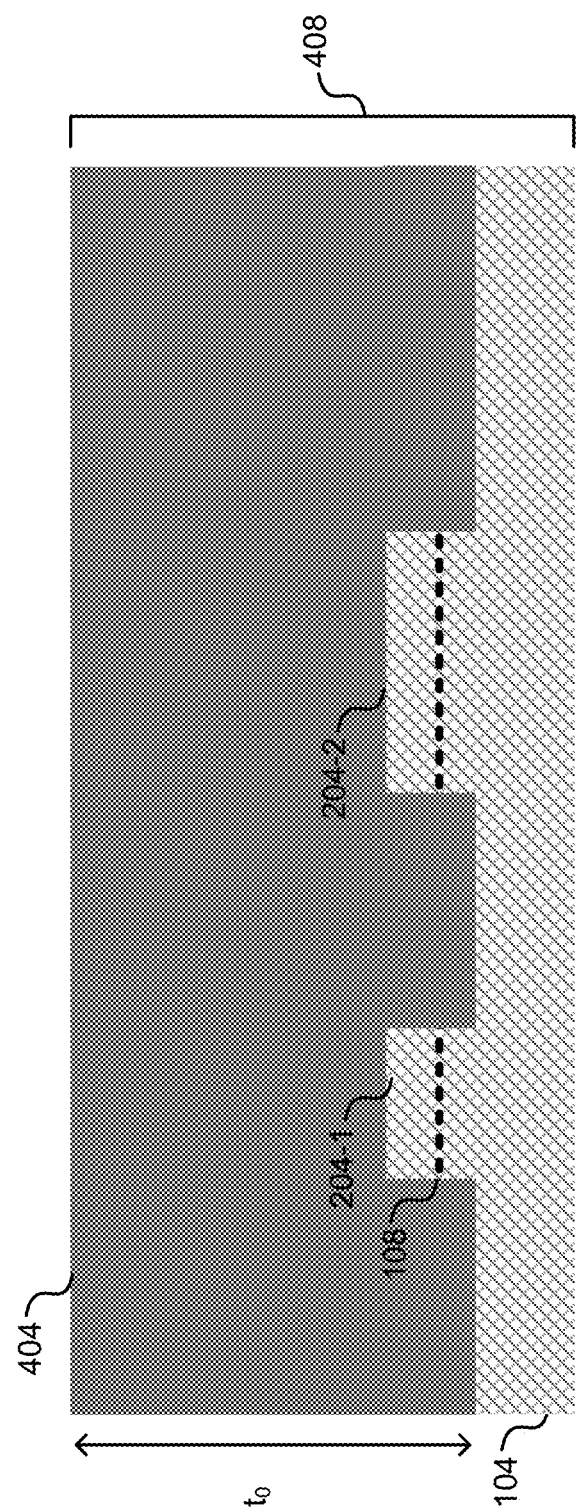
FIG. 4 depicts a simplified cross section of an embodiment of the transfer wafer with compliant material disposed on the transfer substrate.

FIG. 4 depicts a simplified cross section of an embodiment of the transfer wafer with compliant material 404 disposed on the transfer substrate 104. The transfer substrate 104 and the compliant material 404 disposed on the transfer substrate 104 are part of the transfer wafer 408. In some embodiments, chips have different thicknesses and/or are aligned to different vertical heights (z-height) within the target wafer. Thus, in some embodiments, the compliant material 404 is used to assist in providing uniform, and/or substantially uniform, pressure to the chips during bonding the chips to the target wafer. It is sometimes difficult to achieve substantially uniform pressure using a transfer substrate 104 with parts that are all rigid.

In some embodiments, the compliant material 404 is a resin (e.g., HD-3007 from HD MicroSystems). In some embodiments, the compliant material 404 has a thickness that is a function of height variance between a set of chips in order to apply a uniform pressure on the chips. For example, the thickness of the compliant material is such that the compliant material transfers substantially similar force to chips having an absolute height difference of up to 0.5, 1.0, 1.5, 2.0, 2.5, and/or 3 microns; wherein the absolute height is measured from the bottom surface 116 of the transfer substrate 104 to a top of the chip, while the chip is secured to the transfer wafer 408. For example, a chip having a height of 12.3 microns may be in a pit of the compliant material two microns deeper than a chip having a height of 10.1 microns; the absolute height difference would be 0.2 microns. In some embodiments, the compliant material is applied so that the compliant material forms a relatively flat surface parallel to top surfaces of the transfer substrate 104. In some embodiments, an initial thickness, $t_0$, of the compliant material is between 1 to 50 microns, or between 10 and 40 microns (e.g., greater than or equal to 10, 15, 20, 25, 30, 35, or 40 microns).

Figure 5:
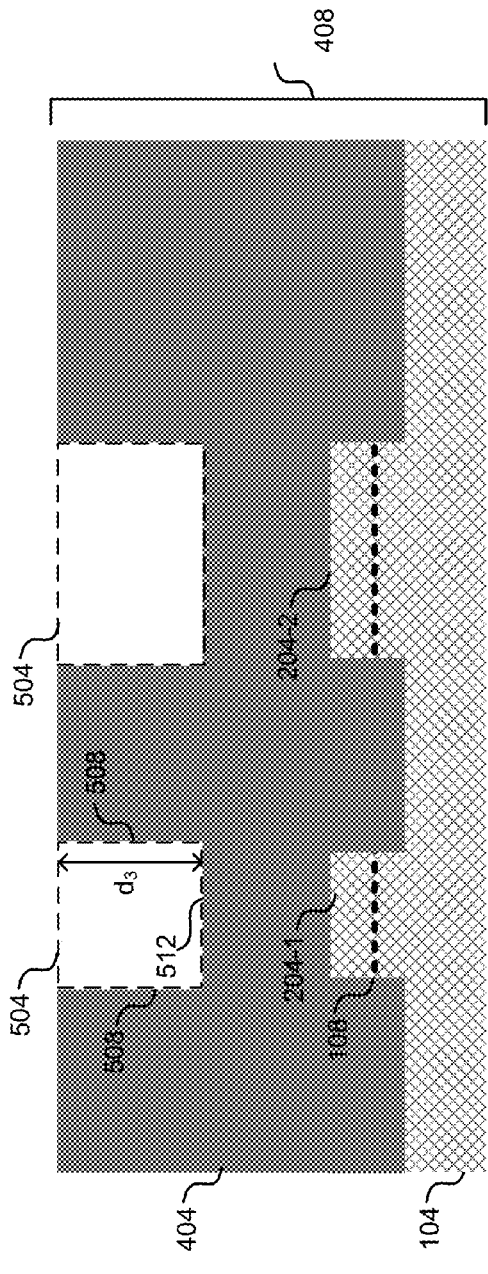
FIGS. 5A and 5B depict simplified cross sections of embodiments of the transfer wafer with pits formed in the compliant material.

FIG. 5A depicts a simplified cross section of an embodiment of the transfer wafer 408 with pits 504 formed in the compliant material 404. The pits 504 are etched to a third depth, $d_3$. In some embodiments, pits 504 have different depths to accommodate different heights and/or types of chips. Walls 508 and a floor 512 of the compliant material 404 form the pit 504. In some embodiments, the third depth, $d_3$, of a pit 504 is greater than or equal to 2, 3, 4, 5, 6, 7, 8, or ten microns. In some embodiments, pits 504 are not used, and chips are secured to the compliant material 404 without pits 504 (the compliant material having an adhesive property). The pits 504 are formed above (in line with and/or over) the risers 204.

FIG. 5B depicts a simplified cross section of an embodiment of the transfer wafer 408 with pits 504 formed in the compliant material 404, wherein a first pit 504-1 has a fourth depth $d_4$ that is less than a fifth depth $d_5$ of a second pit 504-2. In some embodiments, the first pit 504-1 and the second pit 504-2 have different depths to accommodate bonding a first chip 520-1 and a second chip 520-2, wherein the first chip 520-1 has a different height than the second chip 520-2. FIG. 5B provides an example of chips having different heights as discussed in FIG. 4 above.

Figure 6:
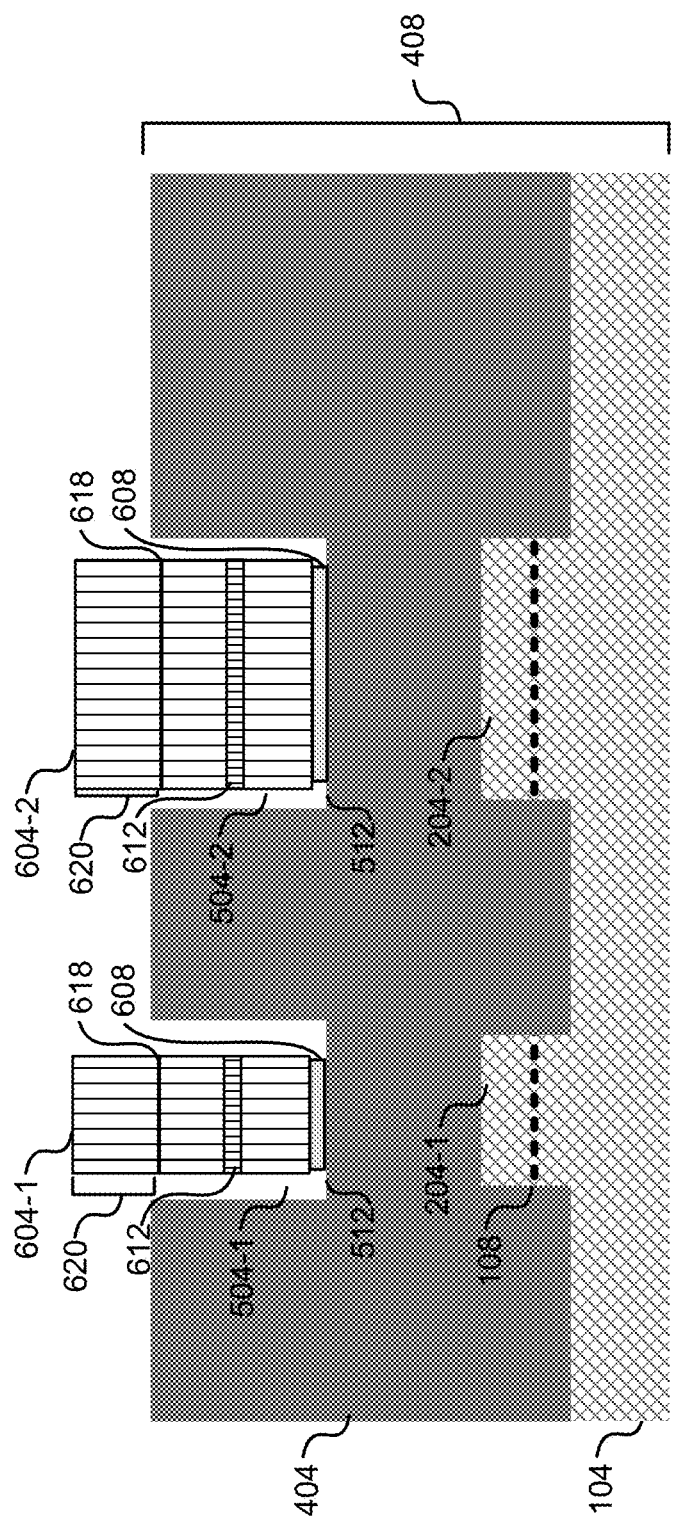
FIG. 6 depicts a simplified cross section of an embodiment of the transfer wafer with chips secured in the pits of the compliant material.

FIG. 6 depicts a simplified cross section of an embodiment of the transfer wafer 408 with a first chip 604-1 secured in a first pit 504-1 and a second chip 604-2 secured in a second pit 504-2 of the compliant material 404. The chips 604 are added to a transfer wafer 408 that is empty (i.e., the transfer wafer 408 having no chips 604 attached). In some embodiments, the chips 604 are picked and placed into the pits 504 of the transfer wafer 408, and the result is a transfer wafer 408 that is populated. In some embodiments, the pick and place process is fully automated. In some embodiments, chips 604 are keyed (e.g., having a particular cross section) and recognized with pattern recognition. Sites for the chips to be secured to (e.g., pits 504) are also recognized with pattern recognition (e.g., pits 504 are not all the same size or shape; for example, some pits 504 have a triangular or trapezoidal cross section). In some embodiments, there are many chips 604 to be secured to the transfer wafer 408 (e.g., more than 100; 1,000; 3,000; 10,000; and/or 50,000 chips) for bonding to the target wafer. In some embodiments, a number of chips 604 secured to the transfer wafer 408 is 3200. In some embodiments, more chips 604 per transfer wafer 408 increases fabrication efficiency.

In FIG. 6, a first chip 604-1 is placed in a pit 504 above the first riser 204-1; a second chip 604-2 is placed in a pit 504 above the second riser 204-2. Each chip 604 comprises a contact layer 608, an active region 612, an etch stop 618, and a substrate portion 620. In some embodiments, the contact layer 608, the substrate portion 620, and/or the etch stop 618 are not part of the chip 604. The etch stop 618 is between the substrate portion 620 and the active region 612. The active region 612 is between the etch stop 618 and the contact layer 608. The contact layer 608 is secured to the floor 512 of the pit 504. In some embodiments, the compliant material 404 is a resin that has an adhesive property, so that a force applied to the chip 604 in a direction toward the floor 512 of the pit 504, while the chip 604 is in the pit 504, causes the chip 604 to become secured (e.g., adhered) to the floor 512 of the pit 504 of the compliant material 404.

The chips 604 comprise material that has some property that is different than material that is part of the target wafer. For example, the target wafer is silicon and the chips 604 are made of III-V material. The III-V material has a direct bandgap, which the silicon does not. Light emission is more easily accomplished with a semiconductor having direct-bandgap material. Thus the III-V material can more easily be a light source than the silicon of the target wafer. The active region 612 of the chip 604 is used for either a gain medium for a laser or for modulation of a laser beam, in this embodiment. For example, the active region 612 comprises quantum wells for gain medium of a semiconductor laser (and the mirrors, e.g., Bragg gratings, of the semiconductor laser are formed in silicon of the target wafer).

The contact layer 608 is added to the chip 604 before the chip 604 is secured to the compliant material 404. In some embodiments, the contact layer 608 is a metal. In some embodiments, the contact layer 608 is a semiconductor (e.g., InGaAs or InGaP). The contact layer 608 is used to connect the chip 604 to an electrical current after the chip 604 is bonded to the target wafer. In some embodiments, the contact layer 608 is added to the chip 604 after the chip 604 is bonded to the target wafer.

The etch stop 618 is used for a high selectivity chemical etch to remove the substrate portion 620. The etch stop 618 is made of different material than the substrate portion 620, and the etch stop 618 is epitaxially connected to the substrate portion 620. Examples of material for the etch stop 618 include InGaAs and InGaAsP for chips 604 having a substrate portion 620 made of InP. A person skilled in the art will recognize that other materials could be used for the substrate portion 620 and/or the etch stop 618 (e.g., using GaAs for the substrate portion 620). In some embodiments, the etch stop 618 also serves as a semiconductor layer used for making an electrical contact. Thus, in some embodiments, the etch stop 618 is highly doped and/or has a lower band-gap to enhance performance of future metal contact and/or reduce electrical current spent in the chip. In some embodiments, before the chip 604 is bonded to the target wafer 1004, the chip 604 does not have any contact layers 608 and contact layers 608 may be added later.

Figure 7A:
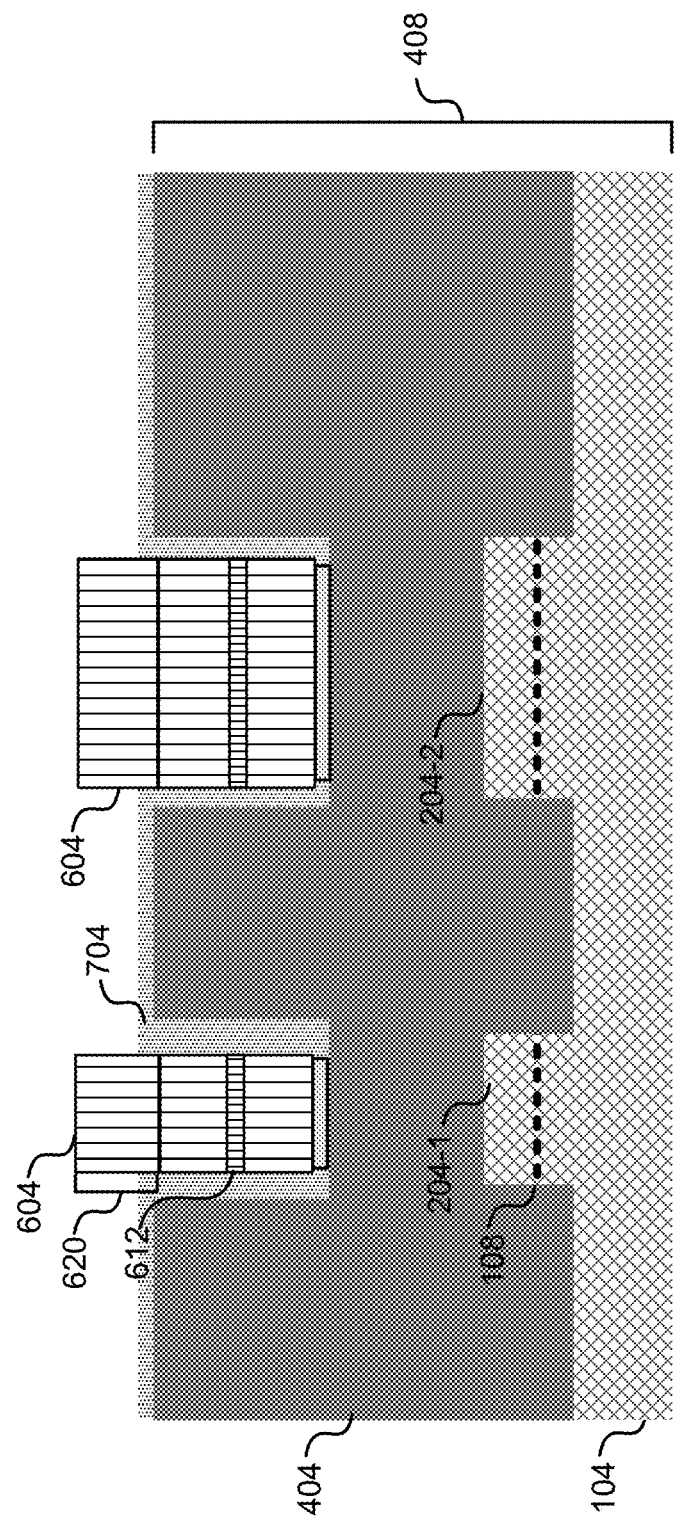
FIG. 7A depicts a simplified cross section of an embodiment of the transfer wafer with photoresist placed in the pits with the chips.

FIG. 7A depicts a simplified cross section of an embodiment of the transfer wafer 408 with photoresist 704 placed in the pits 504 with the chips 604 in the pits 504. In some embodiments, the pits 504 are used for removing material from part of the chip 604 (e.g., removing all or a part of a substrate of the chip 604). For example, the pit 504 is filled with a material (e.g., photoresist 704) so that an active region 612 of the chip 604 is not attacked by acids when removing the substrate portion 620 of the chip 604. In some embodiments, the pits 504 also help with pad deposition used in UBM (under-bump metallization). For example, in FIG. 8, there is a relatively small height difference between tops of chips 604 and a top of the compliant material 404, making it easier to uniformly coat the chips 604 with photoresist 704 (if the chips 604 were on top of the compliant material 404, without pits 504, then in order to form features on tops of chips 604 would involve applying photoresist 704 as thick as the chips 604 across the transfer wafer 408; and applying photoresist 704 several microns thick, uniformly, across the transfer wafer 408, without pits 504, can be challenging). In some embodiments, tops of chips 604 in FIG. 8 are slightly below an initial thickness of the compliant material 404 (e.g., so less photoresist is needed and/or the photoresist is more easily applied).

Figure 7B:
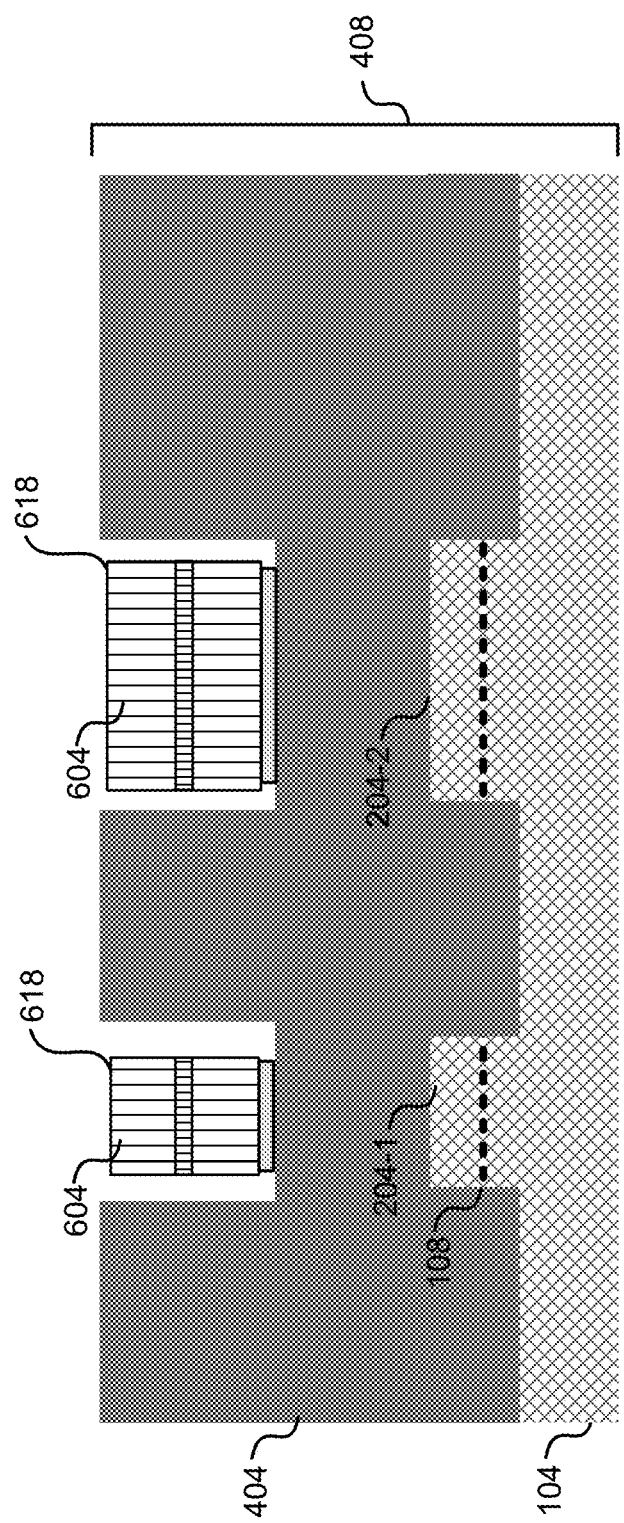
FIG. 7B depicts a simplified cross section of an embodiment of the transfer wafer with portions of the chips removed.

FIG. 7B depicts a simplified cross section of an embodiment of the transfer wafer 408 with the chips 604 having the substrate portions 620 removed. The substrate portions 620 have been removed by etching the chips 604 to the etch stops 618. In some embodiments, removing the substrate portion 620 comprises applying photoresist, aligning a photomask, exposing the photoresist to UV light, developing and removing the photoresist exposed to the UV light, etching (using a selective etch), and then removing the remaining photoresist.

Figure 8:
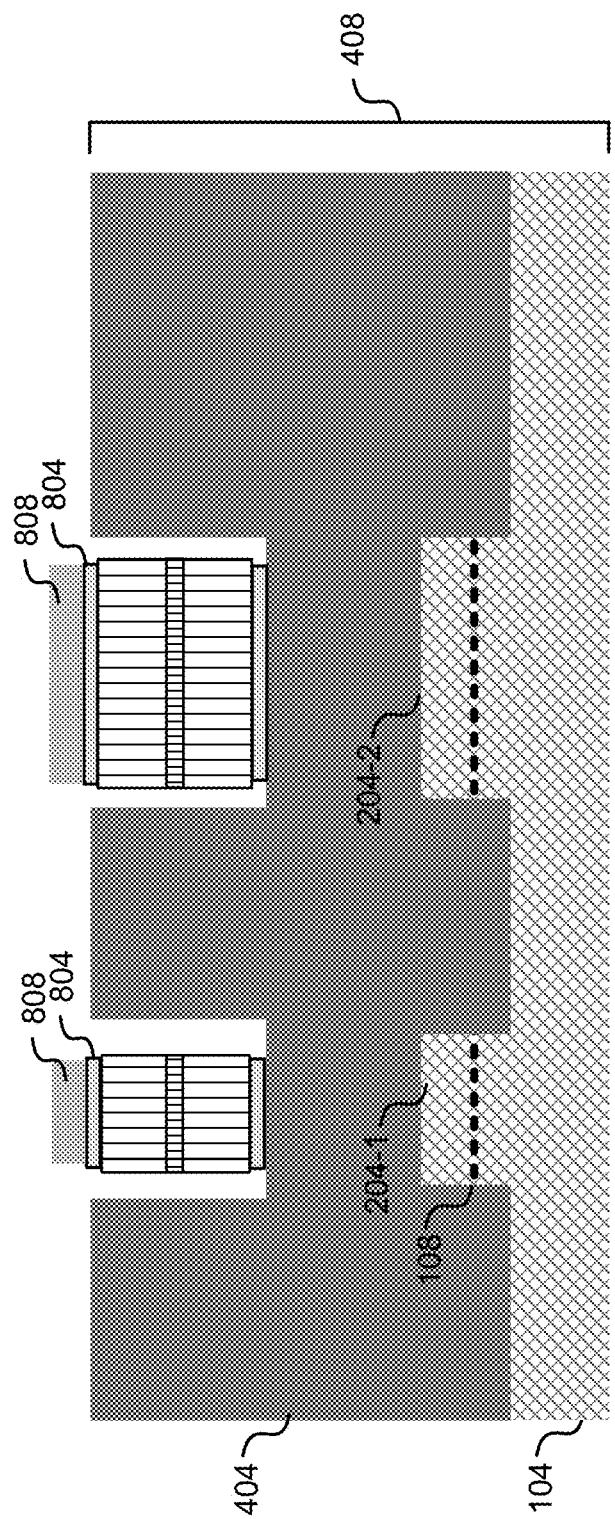
FIG. 8 depicts a simplified cross section of an embodiment of the transfer wafer with material added to the chips.

FIG. 8 depicts a simplified cross section of an embodiment of the transfer wafer 408 with material added to the chips 604. In this embodiment, the material added to the chips 604 are upper-bond pads 804 placed on the chips 604 for UBM when bonding the chips 604 to the target wafer. The upper-bond pads 804 are made of metal. The upper-bond pads 804 are applied using photolithography. In some embodiments, the pits 504 assist in applying photoresist for depositing the upper-bond pads 804.

In some embodiments, bond material 808 is applied to the upper-bond pads 804. Examples of bond material 808 are given in U.S. application Ser. No. 12/902,621, filed on Oct. 12, 2010, which is incorporated by reference.

Figure 9:
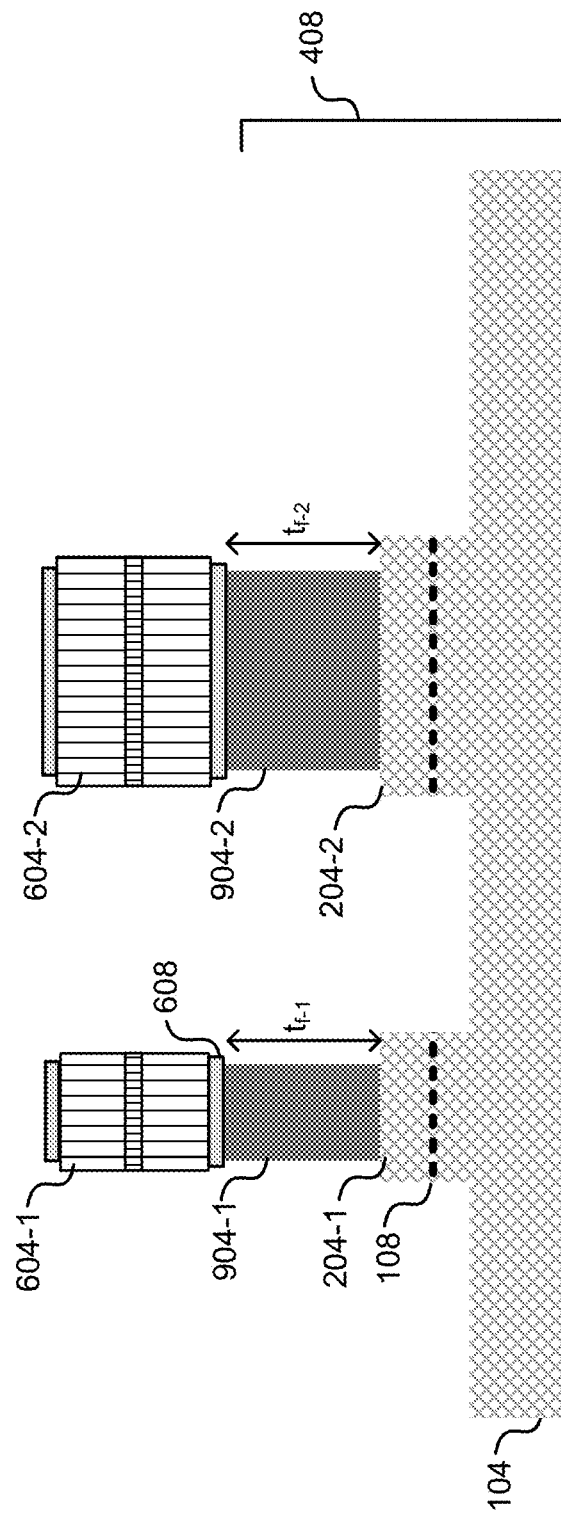
FIG. 9 depicts a simplified cross section of an embodiment of the transfer wafer with excess compliant material removed.

FIG. 9 depicts a simplified cross section of an embodiment of the transfer wafer 408 with excess of the compliant material 404 removed leaving columns 904 of compliant material 404. The columns 904 of compliant material 404 have a final thickness, $t_f$, that is measured from the transfer wafer 408 (in this embodiment from a riser 204 of the transfer wafer 408) to the contact layer 608 of the chip 604. The excess of the compliant material 404 is removed by a self-aligned plasma etch. In some embodiments, the excess of the compliant material 404 forms the column 904 of the compliant material 404, wherein the column 904 has a cross section that is smaller than a cross section of the chip 604.

A first column 904-1 of the compliant material 404 extends between the first riser 204-1 and the first chip 604-1. The first column 904-1 of the compliant material 404 has a first final thickness $t_{f-1}$. A second column 904-2 of the compliant material 404 extends between the second riser 204-2 and the second chip 604-2. The second column 904-2 of the compliant material 404 has a second final thickness $t_{f-2}$. In some embodiments, the first final thickness $t_{f-1}$ is not equal to the second final thickness $t_{f-2}$. For example, the first final thickness $t_{f-1}$ is greater than the second final thickness $t_{f-2}$ because the first chip 604-1 is not as thick as the second chip 604-2. In another example, the first final thickness $t_{f-1}$ is greater than the second final thickness $t_{f-2}$ because the first chip 604-1 is to be placed in a deeper recess of the target wafer than the second chip 604-2.

In some embodiments, FIG. 9 is not to scale. For example, in some embodiments, a thickness of the chip 604 (measured in a vertical direction in FIG. 9) is between 4 and 7 microns, the final thickness $t_f$ of the compliant material 404 is between 15 and 50 microns (e.g., 10, 15, 20, 25, 30, 35, or 40 microns), a chip 604 width (measured in a horizontal direction and/or into the page of FIG. 9) between 50 and 1000 microns, and the riser 204 thickness (measured in the vertical direction in FIG. 9; in some embodiments, the thickness of the riser 204 is equal to the second depth $d_2$) is between 0.5 and 3 microns.

Figure 10:
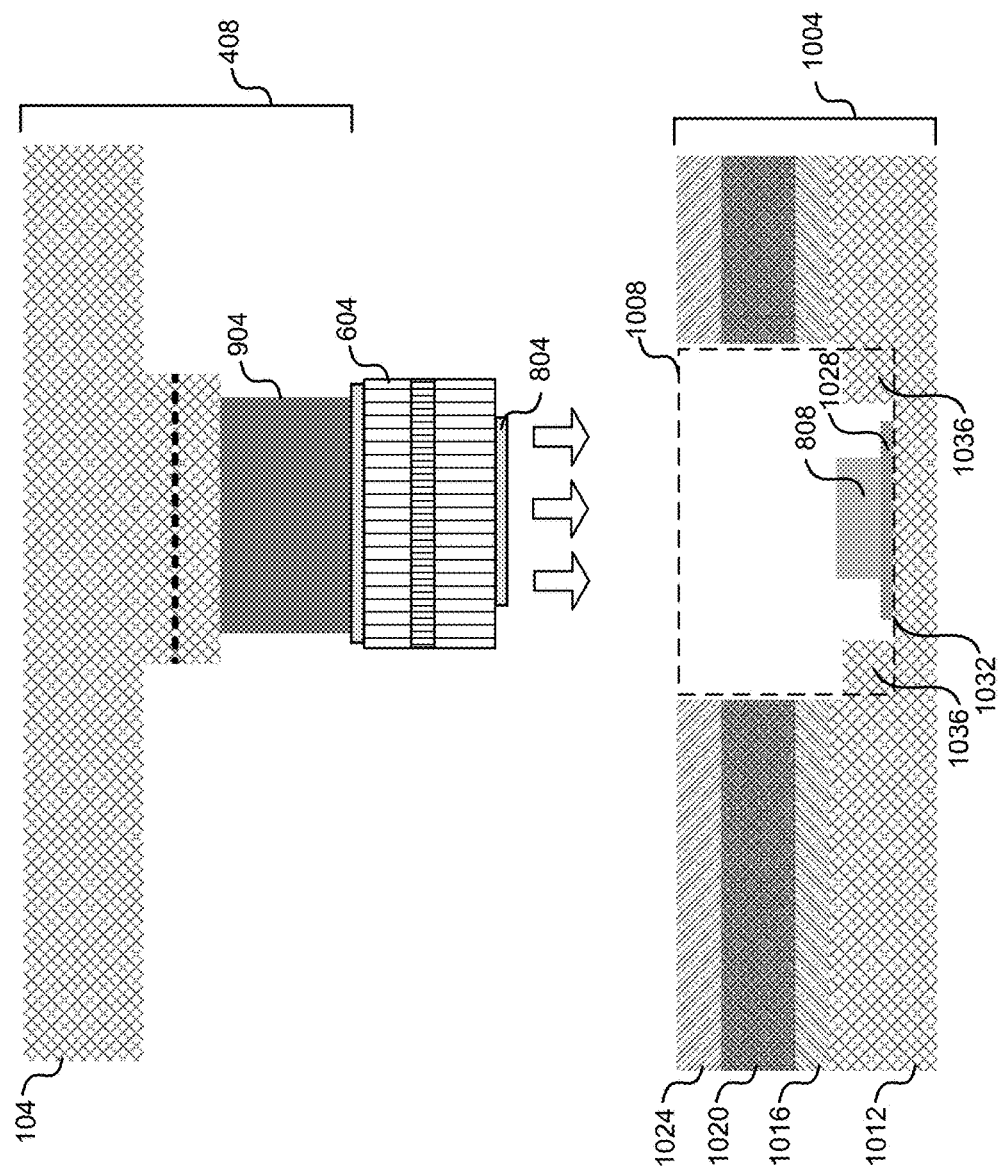
FIG. 10 depicts a simplified cross section of an embodiment of the transfer wafer used to bond a chip to the target wafer.

FIG. 10 depicts a simplified cross section of an embodiment of the transfer wafer 408 used in bonding the chip 604 to the target wafer 1004. The transfer wafer 408 and the target wafer 1004 are aligned so that the chip 604 is aligned with a target site (e.g., recess 1008) of the target wafer 1004. The transfer wafer 408 is then moved toward the target wafer 1004, positioning the chip 604 in the recess 1008 of the target wafer 1004. FIG. 10 shows an embodiment of the bond material 808 applied to the lower-bond pad 1028 instead of the upper-bond pad 804 before the chip 604 is bonded to the target wafer 1004.

In some embodiments, the target wafer 1004 comprises multiple layers: a target substrate 1012, a first insulation layer 1016, a device layer 1020, and a second insulation layer 1024. The recess 1008 is formed by walls in the first insulation layer 1016, the device layer 1020, and the second insulation layer 1024. A floor 1032 of the recess 1008 is formed in the target substrate 1012. A lower-bond pad 1028 is disposed on the floor 1032 of the recess 1008. The lower-bond pad 1028 is used in UBM in bonding the chip 604 to the target substrate 1012. Pedestals 1036 are formed in the target substrate 1012. The pedestals 1036 are used for vertical alignment of the chip 604 to the target wafer 1004. In some embodiments, the target wafer 1004 is similar to the platform as described in U.S. application Ser. No. 14/509, 914, filed on Oct. 8, 2014, which is incorporated by reference.

Figure 11:
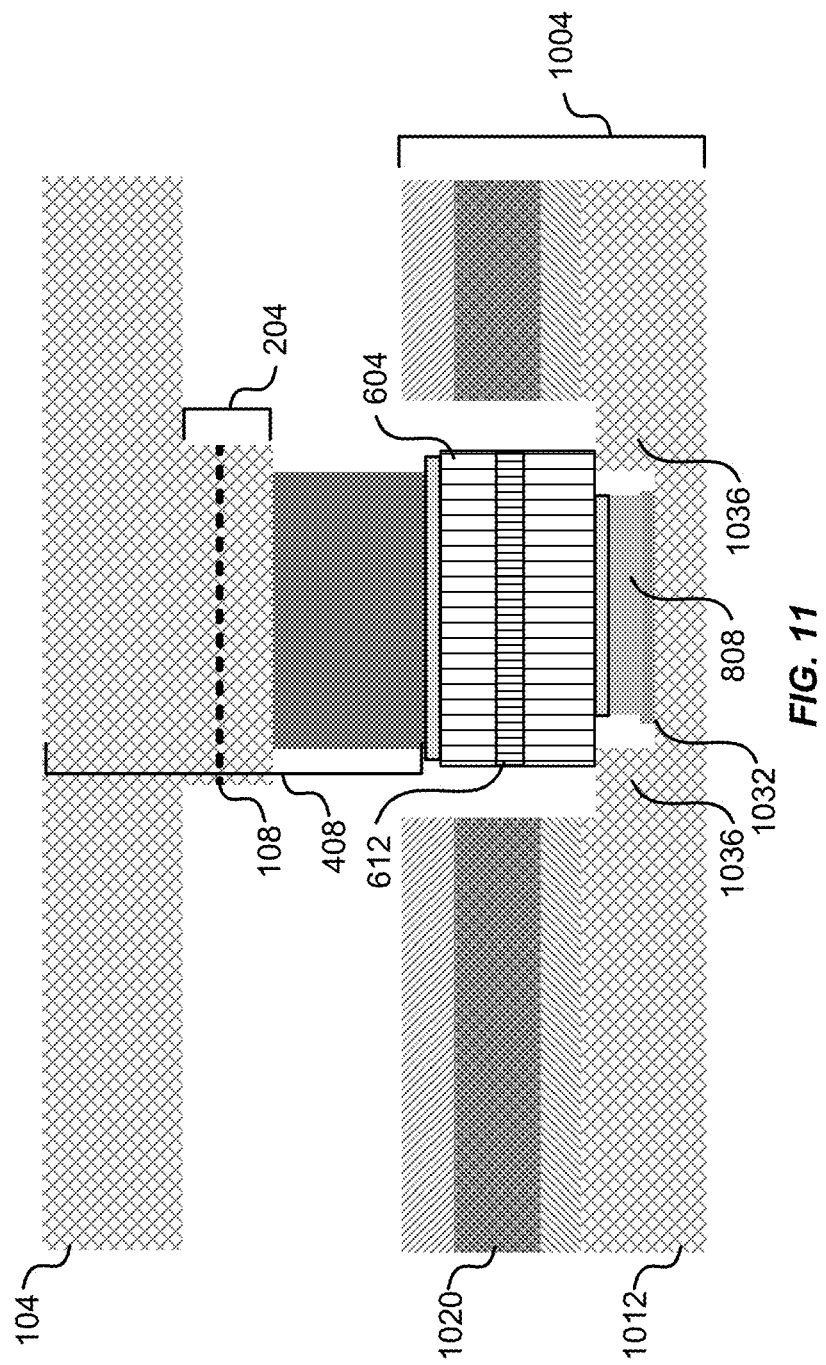
FIG. 11 depicts a simplified cross section of an embodiment of the chip bonding to the target wafer while the chip is secured to the transfer wafer.

FIG. 11 depicts a simplified cross section of an embodiment of the chip 604 bonded to the target wafer 1004 while the chip 604 is secured to the transfer wafer 408. The pedestals 1036 in the target substrate 1012 of the target wafer 1004 are used to align a z-height (i.e., in a vertical direction in of FIG. 11) of the active region 612 of the chip 604 with one or more devices in the device layer 1020 of the target wafer 1004. For example, the active region 612 of the chip 604 is aligned with an optical waveguide in the device layer 1020. In some embodiments, heights of pedestals 1036 are etched before bonding the chip 604 to the target wafer 1004 to accommodate variance in thicknesses of chips 604. For example, even though one recess 1008 in the target wafer 1004 is shown, it is to be understood that the target wafer 1004 comprises many recesses 1008, and that dimensions of the recesses 1008 can be changed to accommodate differences in chips 604. Thus, in some embodiments, different devices are formed on one target wafer 1004 with chips 604 of different type and/or functionality bonded to the one target wafer 1004 using one transfer wafer 408 (e.g., one chip for a laser and a second chip for a modulator). In some embodiments, the chip 604 has an optical, electrical, and/or magnetic property that is not found in the target wafer 1004 (e.g., the chip 604 comprises material that has a direct bandgap and the target wafer 1004 comprises a material that has an indirect bandgap). In some embodiments, the bond material 808 (applied to the upper-bond pad 804 and/or the lower-bond pad 1028) has a thickness (z-height) before bonding that is greater than a thickness (z-height) of the pedestals 1036 (e.g., to ensure compression of the bond material 808). In some embodiments, the thickness of the bond material 808 is not be greater than the thickness of the pedestals 1036, but a total thickness of the upper-bond pad 804, plus bond material 808, plus lower-bond pad 1032 is greater than the thickness of the pedestals 1036 to ensure compression of the bond material 808.

Figure 12:
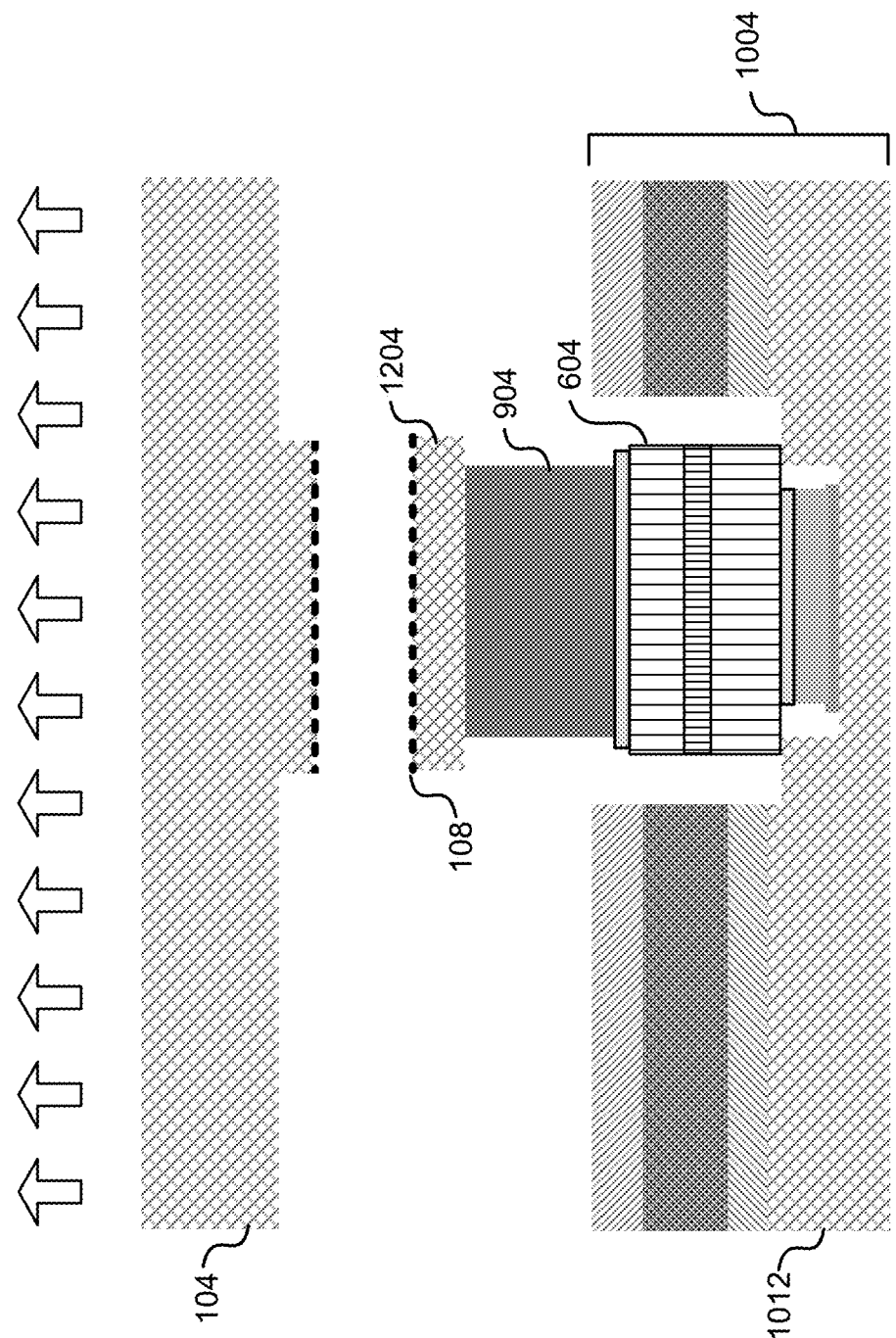
FIG. 12 depicts a simplified cross section of an embodiment of the transfer substrate fracturing at the implant region leaving a residual portion of a riser.

FIG. 12 depicts a simplified cross section of an embodiment of the transfer substrate 104 fracturing at the implant region 108 leaving a residual portion 1204 of the transfer substrate 104. After the transfer substrate 104 fractures at the implant region 108, the residual portion 1204 of the transfer substrate 104 is separable from the transfer substrate 104. In some embodiments, the transfer wafer 408 is heated to more than 200, 250, 300, and/or 350 degrees C. for bonding the chip 604 to the target wafer 1004. In some embodiments, the transfer substrate 104 fractures at the implant region 108, and the transfer substrate 104 is simply lifted off after the bonding process is completed, leaving the residual portion 1204 secured to the column 904 of the compliant material 404, the column 904 of the compliant material 404 secured to the chip 604, and the chip 604 is bonded to the target substrate 1012.

Figure 13:
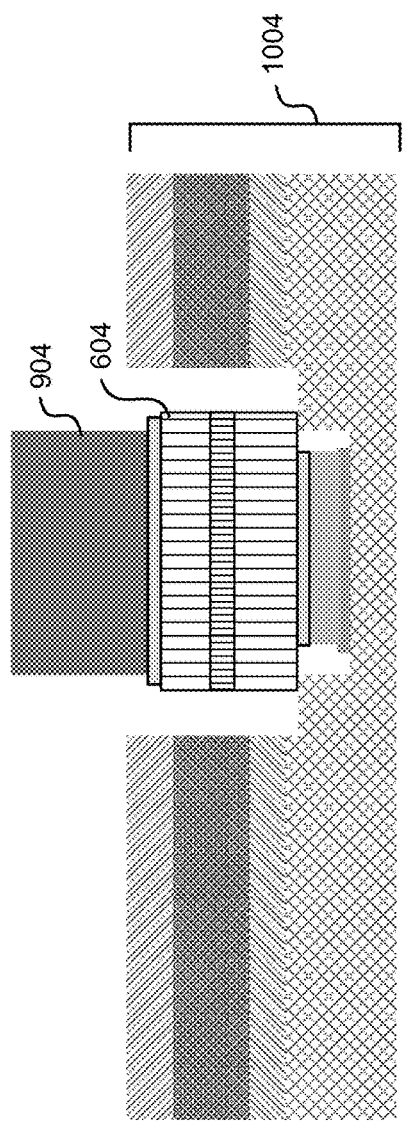
FIG. 13 depicts a simplified cross section of an embodiment of the chip bonded to the target wafer with the residual portion of the riser removed.

FIG. 13 depicts a simplified cross section of an embodiment of the chip 604 bonded to the target wafer 1004 with the residual portion 1204 of the transfer substrate 104 removed. In some embodiments, the residual portion 1204 is removed using a CMOS (Complementary metal-oxide-semiconductor) compatible process (e.g., silicon dry etch process). In some embodiments, photoresist is applied to the target wafer 1004 (e.g., while spinning the target wafer 1004). Photoresist fills the recess 1008 and surrounds the column 904 of the compliant material 404. Thus an optical mask is not needed to expose the photoresist because simply spinning the photoresist on the target wafer 1104 will leave the residual portion 1204 exposed while protecting the target wafer 1004 and the chip 604. After the photoresist is applied to the target wafer 1004, the residual portion 1204 is removed by etching, leaving the column 904 of compliant material 404 secured to the chip 604.

Figure 14:
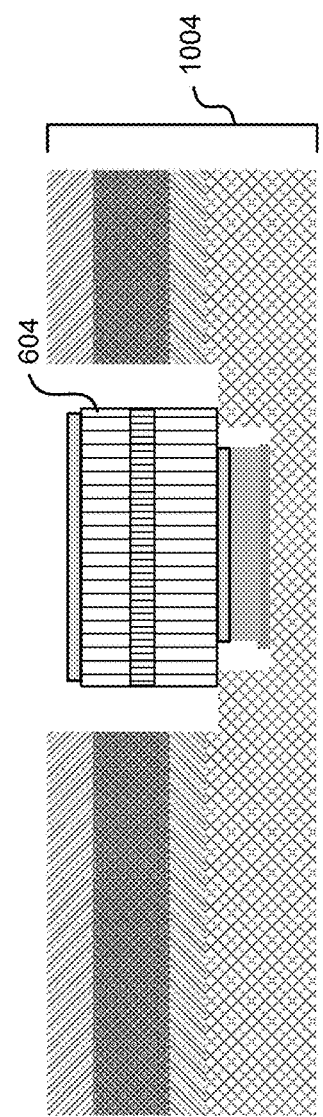
FIG. 14 depicts a simplified cross section of an embodiment of the chip bonded to the target wafer with the compliant material removed.

FIG. 14 depicts a simplified cross section of an embodiment of the chip 604 bonded to the target wafer 1004 with the column 904 of the compliant material 404 removed. In some embodiments, since the residual portion 1204 of the transfer substrate 104 is removed, the column 904 of the compliant material 404 can be removed (e.g., dissolved) with a solvent. In some embodiments, photoresist that was applied to the target wafer 1004 in removing the residual portion 1204 is not removed before the column 904 of the compliant material 404 is removed (e.g., dissolved). In some embodiments, leaving photoresist helps to protect the chip 604 during the process of dissolving the column 904 of the compliant material 404; makes dissolving the column 904 of the compliant material 404 easier (e.g., not as much solvent is used because the solvent does not fill in the recess 1008; and/or reduces an amount of resist used to form features on the chip 604 after bonding the chip 604 to the target wafer 1004 [e.g., forming electrical contacts on the chip 604 after the chip 604 is bonded to the target wafer 1004]).

Figure 15:
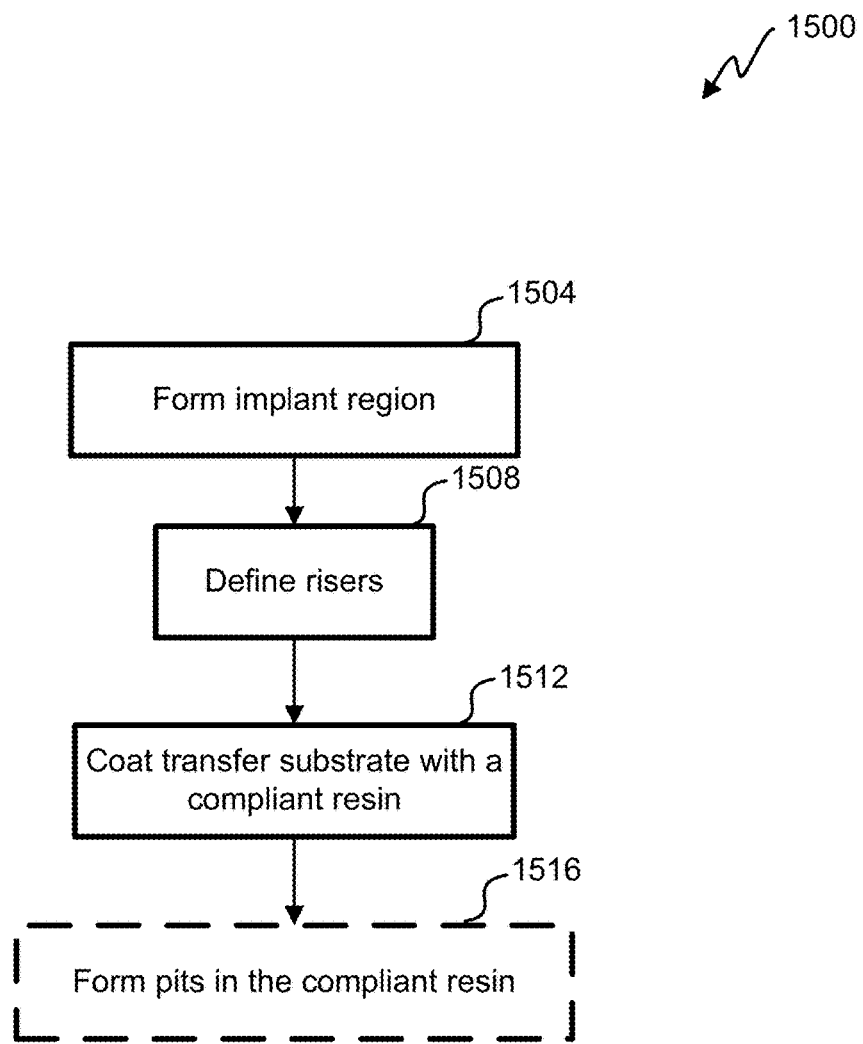
FIG. 15 depicts a flowchart of an embodiment of forming the transfer wafer.

FIG. 15 depicts a flowchart of an embodiment of a process 1500 of forming the transfer wafer 408. The process 1500 of forming a transfer wafer 408 begins in step 1504 where the implant region 108 is formed in the transfer substrate 104. In some embodiments, the transfer substrate 104 is made of silicon. In some embodiments, the transfer substrate 104 is flat silicon. In some embodiments, the implant region 108 is formed by ion implantation. FIG. 1 depicts a cross section of an embodiment of the transfer substrate 104 after the implant region 108 is formed. The implant region 108 is formed at the first depth $d_1$, below the top surface 112 of the transfer substrate 104.

In step 1508, risers 204 are defined in the transfer substrate 104. The risers 204 are formed by using lithography to apply a hard mask (e.g., SiO2), etching the transfer substrate 104 to form the risers 204, and then stripping the hard mask. Portions of the transfer substrate 104 are etched to the second depth $d_2$ from the top surface 112 of the transfer substrate 104. In some embodiments, the second depth $d_2$ is greater than the first depth $d_1$, such that the implant region 108 is within the risers 204. An example of risers 204 formed in the transfer substrate 104 is given in FIG. 2.

In step 1512, the compliant material 404 (e.g., a resin; HD-3007 from HD MicroSystems) is applied to coat the transfer substrate 104. In some embodiments, the compliant material 404 is used in applying a uniform pressure to chips 604 during bonding to the target wafer 1004. An example of compliant material 404 coating the transfer substrate 104 is given in FIG. 4.

In step 1516, an optional step, pits 504 are formed in the compliant material 404. In some embodiments, the transfer substrate 104 is made of a material having a thermal expansion coefficient similar to a thermal expansion coefficient of the target substrate 1012. For example, the thermal expansion coefficient of the transfer substrate 104 and the thermal expansion coefficient of the target wafer 1004 are sufficiently similar that a chip 604 secured to the transfer wafer 408 and aligned to the target substrate 1012 has an offset movement (of a point on the transfer substrate 104 substrate compared to a point on the target wafer 1004) of no more than 1, 3, 5, 7, and/or 10 microns when heated to 300 degrees Celsius. In some embodiments, different pits 504 formed in the compliant material 404 have different depths. In some embodiments, a dry etch using an O2 plasma forms the pits 504. An example of pits 504 formed in the compliant material 404 is given in FIG. 5.

Figure 16:
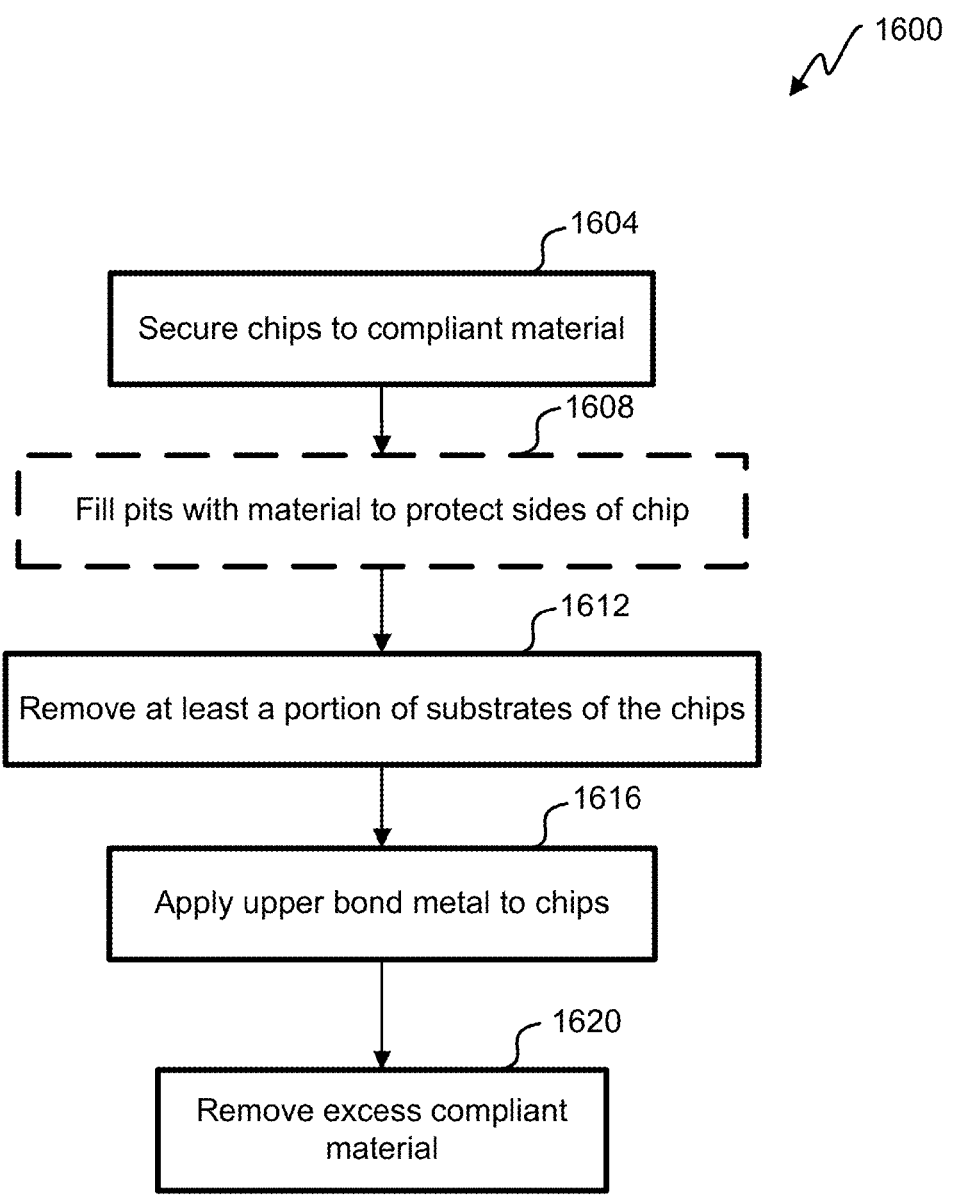
FIG. 16 depicts a flowchart of an embodiment of placing chips on the transfer wafer and preparing the transfer wafer for bonding the chips to the target wafer.

FIG. 16 depicts a flowchart of an embodiment of a process 1600 of placing (e.g., securing) chips 604 on the transfer wafer 408, and preparing the chips 604 and the transfer wafer 408 for bonding the chips 604 to the target wafer 1004. In some embodiments, step 1604 occurs after step 1516 of process 1500 of forming the transfer wafer 408. In step 1604, one or more chips 604 are secured to the compliant material 404. In some embodiments, the chips 604 are placed in pits 504 of the compliant material 404. In some embodiments, chips 604 are placed in the pits 504 by an automated pick-and-place process. An example of chips 604 placed in pits 504 of the compliant material 404 is given in FIG. 6.

In step 1608, an optional step, the pits 504 are filled with material (e.g., photoresist and/or a polymer) to protect sides of chips 604. An example of pits 504 filled with photoresist is given in FIG. 7A. In step 1612, the substrate portions 620 of the chips 604 are removed. In some embodiments, the substrate portions 620 are removed using a selective etch (e.g., etching to the etch stop 618). The photoresist 704 is stripped off the transfer wafer 408 after etching the substrate portions 620. In some embodiments, the photoresist 704 is stripped off the transfer wafer 408 after step 1616. In some embodiments, a mask for applying the photoresist 704 is not used because the photoresist is applied (e.g., and spun) to fill the pits 504 of the compliant material 404. The photoresist 704 is hardened and the substrate portions 620 etched. An example of chips 604 with substrate portions 620 removed is given in FIG. 7B.

In step 1616, the upper-bond pads 804 are patterned on the chips 604. In some embodiments, photolithography is used to pattern the upper-bond pads 804 on the chips 604. In some embodiments, the upper-bond pads 804 are a metal alloy deposited using a liftoff process. In some embodiments, bond material 808 is also applied to upper-bond pads 804 of the chips 604. In some embodiments, the bond material 808 is applied to the lower-bond pads 1028 instead of, or in addition to, the upper-bond pads 804 before the chip 604 is bonded to the target wafer 1004. For example, bond material 808 is easier to clean before bonding if the bond material 808 is applied to the lower-bond pads 1028. Some cleaning materials used in cleaning the bond material 808 may harm III-V material in the chip 604. Thus if the bond material 808 is on the target wafer 1004 when cleaned, the chip 604, which is on the transfer 408, is not exposed to the cleaning materials. An example of upper-bond pads 804 and bond material 808 applied to the chips 604 is given in FIG. 8.

In step 1620, excess of the compliant material 404 is removed, leaving the columns 904 of compliant material 404 between the risers 204 and the chips 604. In some embodiments, a plasma etch (e.g., O2 dry etch) is used to remove the excess of the compliant material 404. An example of the excess of the compliant material 404 removed is given in FIG. 9.

Figure 17:
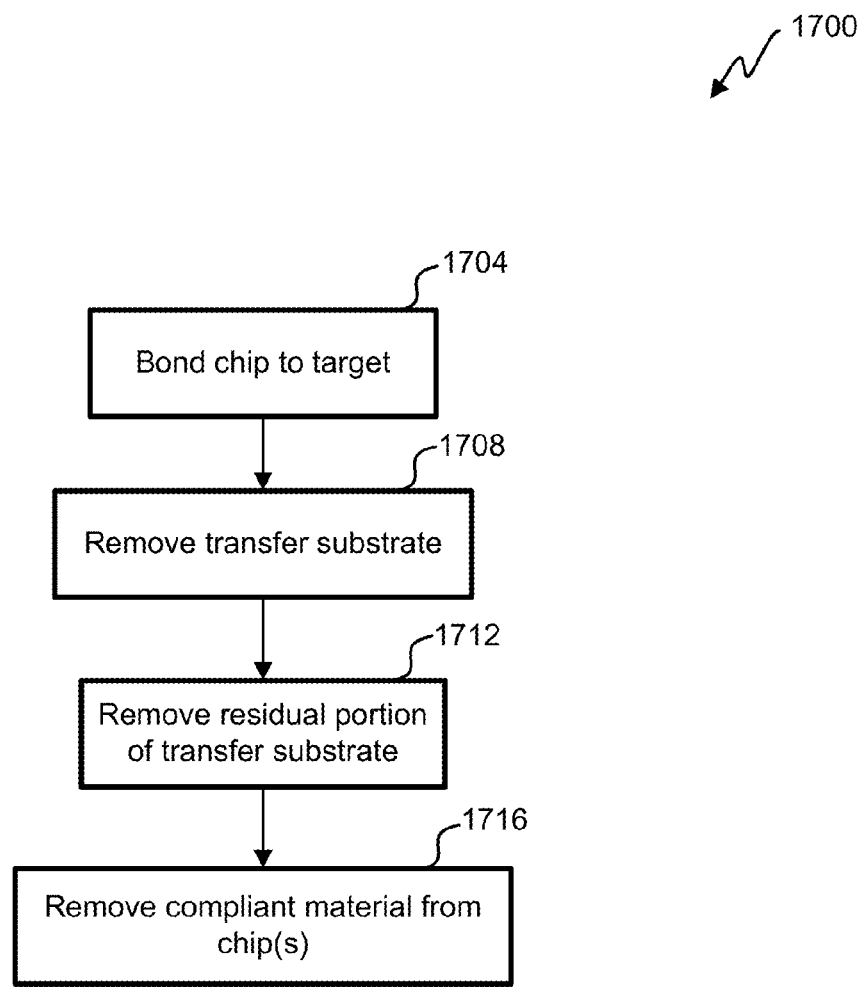
FIG. 17 depicts a flowchart of an embodiment of bonding the chip to the target wafer and removing the transfer wafer.

FIG. 17 depicts a flowchart of an embodiment of a process of bonding the chip 604 to the target wafer 1004 and removing the transfer wafer 408. In some embodiments, step 1704 occurs after step 1620 in the process 1600 of placing chips 604 on the transfer wafer 408, and preparing the chips 604 and transfer wafer 408 for bonding the chips 604 to the target wafer 1004. In step 1704, chips 604 are bonded to the target wafer 1004. Examples of bond material 808 are given in the '621 application. In some embodiments, bonding the chips 604 to the target wafer 1004 comprises one or more of the following steps: pre-cleaning metal used in bonding; flipping and aligning the transfer wafer 408 with the target wafer 1004 so that chips 604 are aligned with target sites (e.g., recesses 1008) of the target wafer 1004; applying a force to the transfer wafer 408 in a direction to the target wafer 1004 and/or applying a force to the target wafer 1004 in a direction toward the transfer wafer 408; and applying heat to the bond material 808 (e.g., applying heat to the transfer wafer 408) so that the bond material 808 bonds the chip 604 to the target substrate 1012. In some embodiments, bonding occurs under reduced pressure (e.g., vacuum). An example of the chip 604 bonded to the target substrate 1012 is given in FIG. 11.

In step 1708, the transfer substrate 104 is removed. During bonding, the transfer substrate 104 fractures at the implant region 108 because of heat applied to the transfer substrate 104. In some embodiments, the riser 204 has a width that is greater than a width of the recess 1008 to reduce debris from falling in the recess 1008 when the transfer substrate 104 fractures at the implant region 108 (the width being measured in a direction orthogonal to the second depth, $d_2$). After the chip 604 is bonded to the target wafer 1004, and the transfer substrate 104 fractures at the implant region 108, the transfer substrate 104 is removed (e.g., simply lifted) leaving the residual portion 1204 of the riser 204 secured to the column 904 of the compliant material 404. An example of removing the transfer substrate 104 and leaving the residual portion 1204 is given in FIG. 12.

In step 1712, the residual portion 1204 is removed using a selective dry etch. In some embodiments, the residual portion 1204 is silicon and the second insulation layer 1024 of the target wafer 1004 is silicon-dioxide. Thus a selective dry etch of silicon can remove the residual portion 1204. An example of the chip 604 bonded to the target wafer 1004 with the residual portion 1204 removed is given in FIG. 13.

In step 1716, the column 904 of the compliant material 404 is removed. In some embodiments, the column 904 of the compliant material 404 is removed with solvent. In some embodiments, the chip 604 does not need protection from the solvent used to remove the column 904 of the compliant material 404. In some embodiments, the chip 604 is further cleaned and further processed. An example of the chip 604 bonded to the target wafer 1004 with the column 904 of the compliant material 404 removed is given in FIG. 14.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

The above description of exemplary embodiments of the invention has been presented for the purposes of illustration and description. It is not intended to be exhaustive or to limit the invention to the precise form described, and many modifications and variations are possible in light of the teaching above. For example, in some embodiments, 3200 chips 604 are secured to a transfer wafer 408 and then bonded into 3200 recesses 1008 of the target wafer 1004. The target wafer 1004 is then divided into 400 devices, each device having eight chips 604. Of the eight chips 604 in each device, four chips 604 are used as gain mediums for lasers and four chips 604 are used for modulators. Thus each device has four lasers and four modulators. But more or fewer lasers and/or modulators could be in each device. Additionally, steps of processes can be optional. For example, in process 1600 of placing chips 604 on the transfer wafer 408, step 1612 of removing portions of substrates of the chips 604 is optional. For example, in some embodiments, the substrates of chips 604 are removed before placing chips 604 in pits 504.

The embodiments were chosen and described in order to explain the principles of the invention and practical applications to thereby enable others skilled in the art to best utilize the invention in various embodiments and with various modifications as are suited to the particular use contemplated.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc.

A recitation of "a", "an", or "the" is intended to mean "one or more" unless specifically indicated to the contrary.

All patents, patent applications, publications, and descriptions mentioned here are incorporated by reference in their entirety for all purposes. None is admitted to be prior art.

What is claimed is:

1. A method of bonding a chip to a target substrate, the method comprising:
   forming a compliant layer on a surface of a transfer substrate;
   forming a pit in the compliant layer by removing a portion of the compliant layer, the pit having a first depth from a surface of the compliant layer and a width, the first depth being less than a thickness of the chip, and the first width being greater than a width of the chip;
   securing the chip to a bottom of the pit, such that a portion of the chip protrudes above the surface of the compliant layer and there is a gap between a sidewall of the chip and a sidewall of the pit;
   forming a photoresist layer on the surface of the compliant layer, wherein the photoresist layer fills the gap between the sidewall of the chip and the sidewall of the pit;
   removing the portion of the chip that protrudes above the surface of the compliant layer;
   aligning the transfer substrate with the target substrate;
   bonding the chip to the target substrate while applying a pressure on the transfer substrate against the target substrate through the compliant layer;
   removing the transfer substrate from the compliant layer; and
   removing the compliant layer.

2. The method of claim 1, wherein the compliant layer comprises a resin.

3. The method of claim 1, wherein the compliant layer has a thickness ranging from about 10 microns to about 40 microns.

4. The method of claim 1, wherein:
   the transfer substrate comprises silicon;
   the target substrate comprises silicon; and
   the chip comprises a III-V semiconductor material.

5. The method of claim 1, wherein the transfer substrate is opaque to light in a wavelength range from 200 nm to 400 nm.

6. The method of claim 1, further comprising:
   before forming the compliant layer, forming an implant region in the transfer substrate;
   wherein removing the transfer substrate from the compliant layer comprises fracturing the transfer substrate at the implant region.

7. The method of claim 1, further comprising forming a first bond pad on a surface of the chip after removing the portion of the chip that protrudes above the surface of the compliant layer and before bonding the chip to the target substrate.

8. The method of claim 7, wherein the first bond pad is formed on the surface of the chip using photolithography.

9. The method of claim 7, wherein the target substrate comprises:
   a second bond pad on a surface of the target substrate;
   wherein the chip is bonded to the target substrate via a bond material disposed between the first bond pad and the second bond pad.

10. A method of bonding a chip to a target substrate, the method comprising:
    forming an implant region in a transfer substrate, the implant region being at a first depth from a surface of the transfer substrate;
    forming a compliant layer on the surface of the transfer substrate;
    securing the chip to the compliant layer, wherein a portion of the chip extends above a surface of the compliant layer;
    removing the portion of the chip that extends above the surface of the compliant layer;
    aligning the transfer substrate with the target substrate;
    bonding the chip to the target substrate while applying a pressure on the transfer substrate against the target substrate through the compliant layer;
    removing the transfer substrate from the compliant layer by fracturing the transfer substrate at the implant region; and
    removing the compliant layer.

11. The method of claim 10, wherein:
    securing the chip to the compliant material further comprises forming a pit in the compliant layer by removing a portion of the compliant layer, the pit having a depth from the surface of the compliant layer and a width, the depth of the pit being less than a thickness of the chip; and
    the chip is secured to a bottom of the pit.

12. The method of claim 11, wherein:
    the first width of the pit is greater than a width of the chip such that there is a gap between a sidewall of the chip and a sidewall of the pit after the chip is secured to the bottom of the pit; and
    removing the portion of the chip that extends above the surface of the compliant layer comprises:
        forming a photoresist layer on the surface of the compliant layer, the photoresist layer filling the gap between the sidewall of the chip and the sidewall of the pit; and
        performing photolithography to remove the portion of the chip that extends above the surface of the compliant layer.

13. The method of claim 10, wherein the compliant layer comprises a resin.

14. The method of claim 10, wherein the compliant layer has a thickness ranging from about 10 microns to about 40 microns.

15. The method of claim 10, the transfer substrate is opaque to light in a wavelength range from 200 nm to 400 nm.

16. The method of claim 10, wherein:
    the transfer substrate is silicon; and
    the target substrate is silicon.

17. A transfer structure for bonding a chip to a target substrate, the transfer structure comprising:
    a transfer substrate having an implant region at a first depth from a surface of the transfer substrate;
    the chip; and
    a compliant layer formed on the surface of the transfer substrate, wherein:
        the compliant layer defines a pit;
        the chip is secured to a bottom of the pit;
        the pit has a depth from a surface of the compliant layer and a width;
        the depth of the pit is less than a thickness of the chip so that the chip extends above the surface of the compliant layer;
        the width of the pit is greater than a width of the chip so that there is a gap between a sidewall of the pit and a sidewall of the chip; and
        the gap between the sidewall of the pit and the sidewall of the chip is filled by a photoresist material.

18. The transfer structure of claim 17, wherein:
the compliant layer comprises a resin;
the chip comprises III-V material; and
the transfer substrate comprises silicon.

19. The transfer structure of claim 17 wherein the compliant layer has a thickness ranging from about 10 microns to about 40 microns.

20. The transfer structure of claim 17, wherein the transfer substrate is opaque to light in a wavelength range from 200 nm to 400 nm.

* * * * *